United States Patent [19]

Asami

[11] 4,289,956
[45] Sep. 15, 1981

[54] TIME-PERIOD COMPARING DEVICE
[75] Inventor: Fumitaka Asami, Kunitachi, Japan
[73] Assignee: Fujitsu Limited, Japan
[21] Appl. No.: 40,410
[22] Filed: May 18, 1979
[30] Foreign Application Priority Data
  May 23, 1978 [JP] Japan ................................. 53-61279
[51] Int. Cl.³ ...................... H03K 21/30; G06M 3/02
[52] U.S. Cl. ............................ 235/92 T; 235/92 CA;
  235/92 FQ; 235/92 PE
[58] Field of Search ........... 235/92 CA, 92 T, 92 FQ,
  235/92 CC, 92 PE; 328/134; 340/679

[56] References Cited
U.S. PATENT DOCUMENTS 3,714,645  1/1973  Siverton .......................... 235/92FQ
3,843,871 10/1974  Fujimaki et al. ................. 235/92 V
3,906,346  9/1975  Hunter .......................... 235/92 CA
3,981,440  9/1976  Richardson .................... 235/92 FQ
4,052,676 10/1977  Crittenden ..................... 235/92 FQ Primary Examiner—Joseph M. Thesz
Attorney, Agent, or Firm—Staas & Halsey

[57] ABSTRACT

A time-period comparing device for use in, for example, monitoring the rotational velocity of a fan. The device compares the time-period of an input signal with a reference signal. The device includes a reference oscillator, a reference period counter for generating the reference signal and a time-period comparator for comparing the input signal with the reference signal. The device also includes means for preventing the device from operating when the input signal is an irregular signal and means for stopping this device from operating for a definite interval after the power is turned on.

23 Claims, 35 Drawing Figures

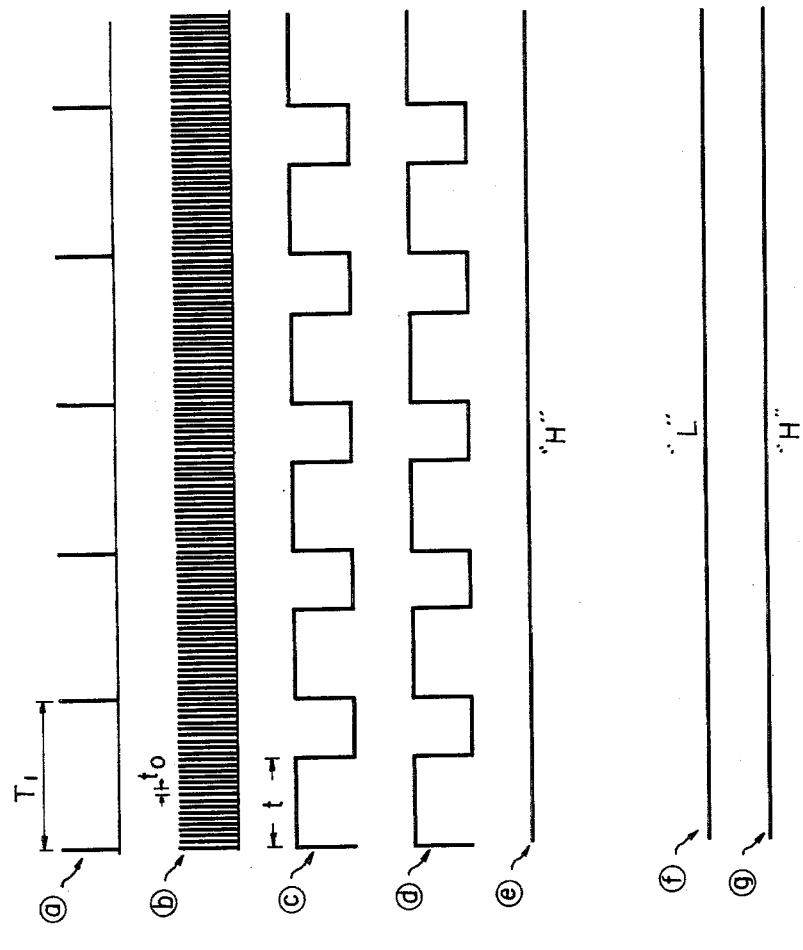

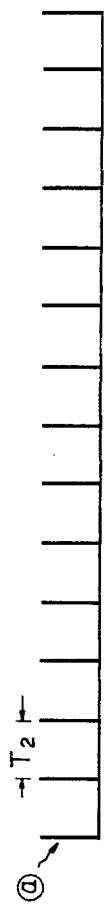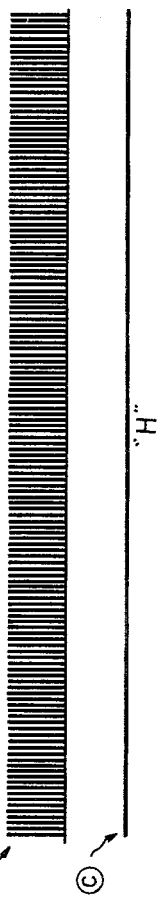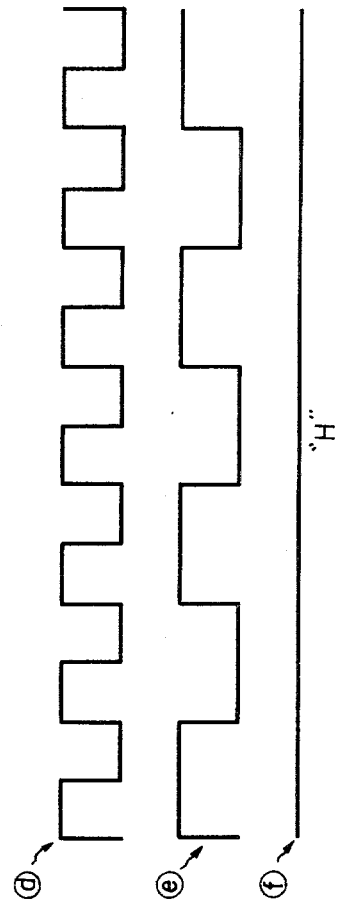
Fig. 3A
Fig. 3B
Fig. 3C
Fig. 3D
Fig. 3E
Fig. 3F
Fig. 3G

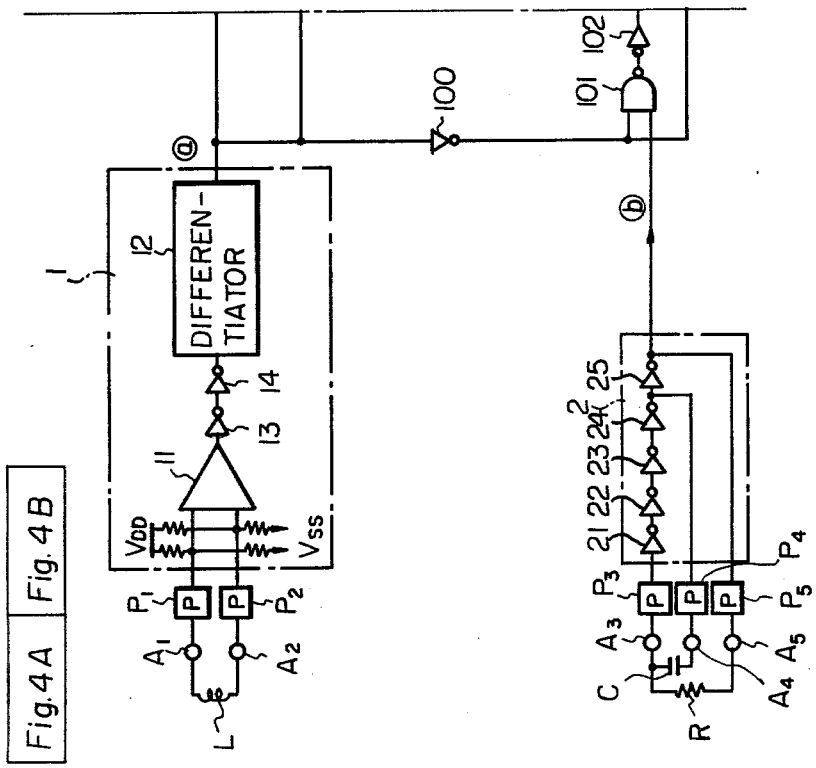

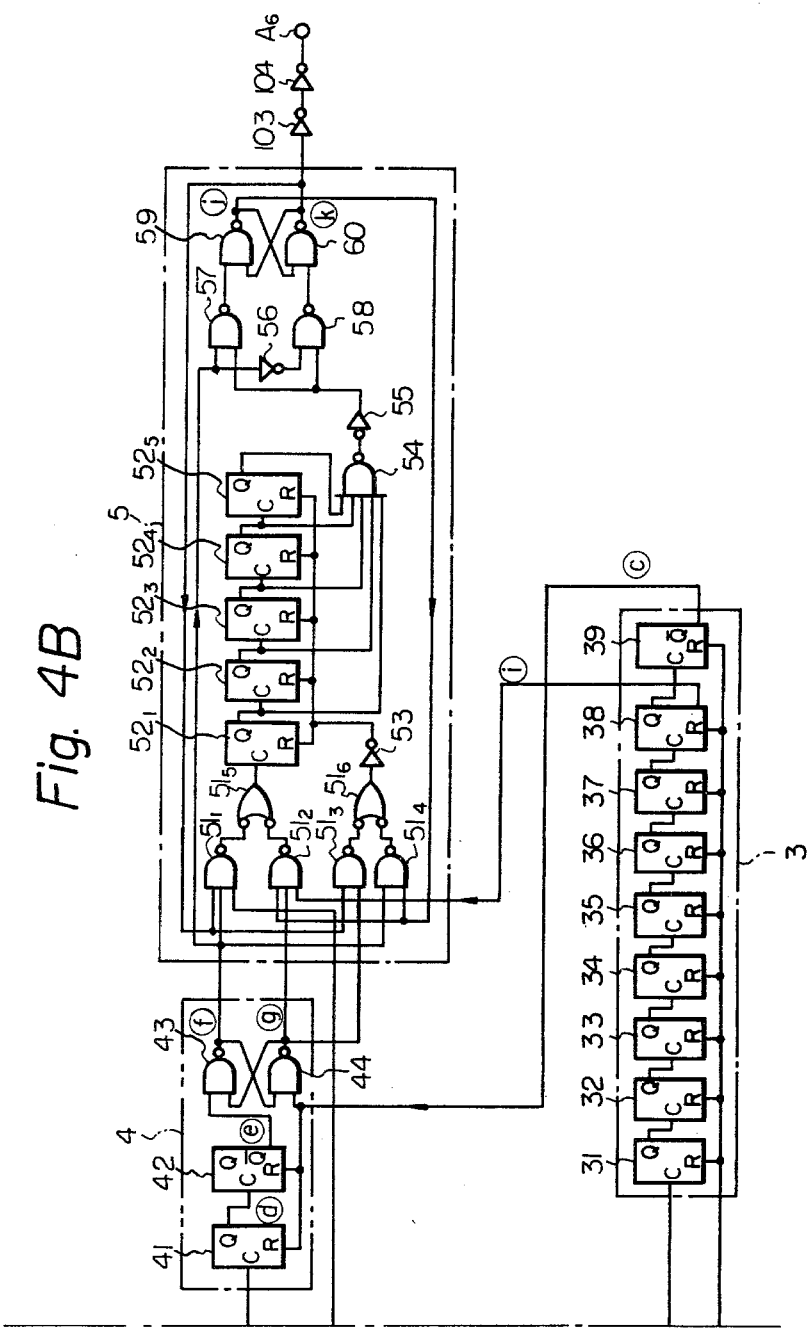

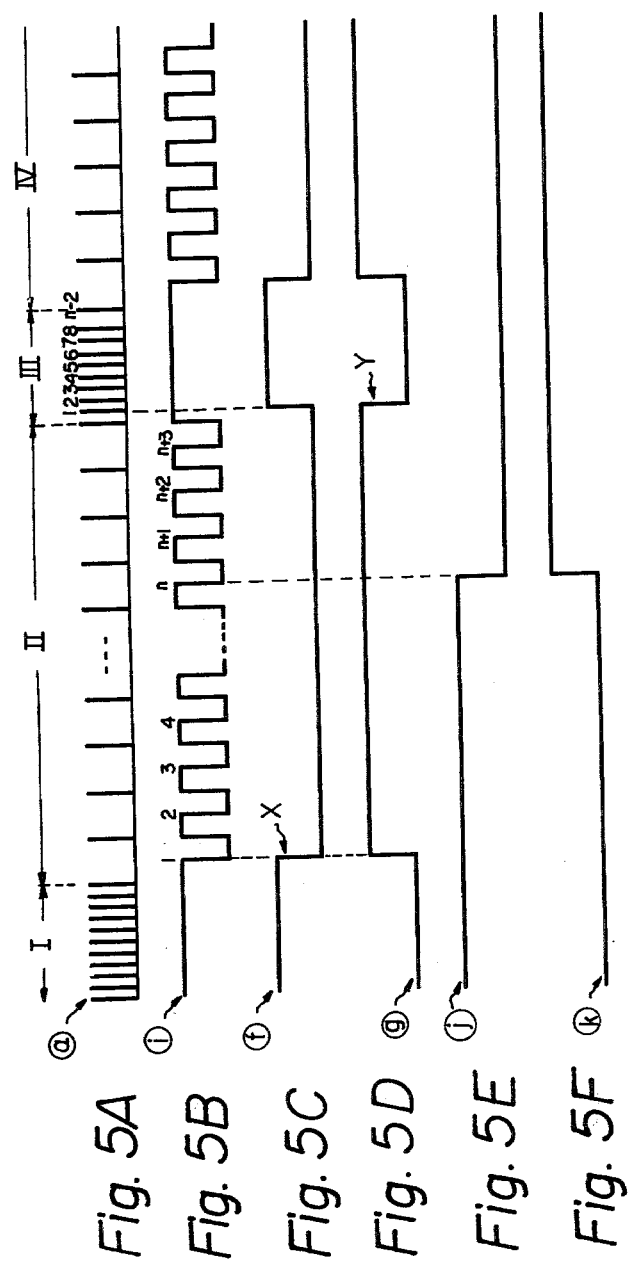

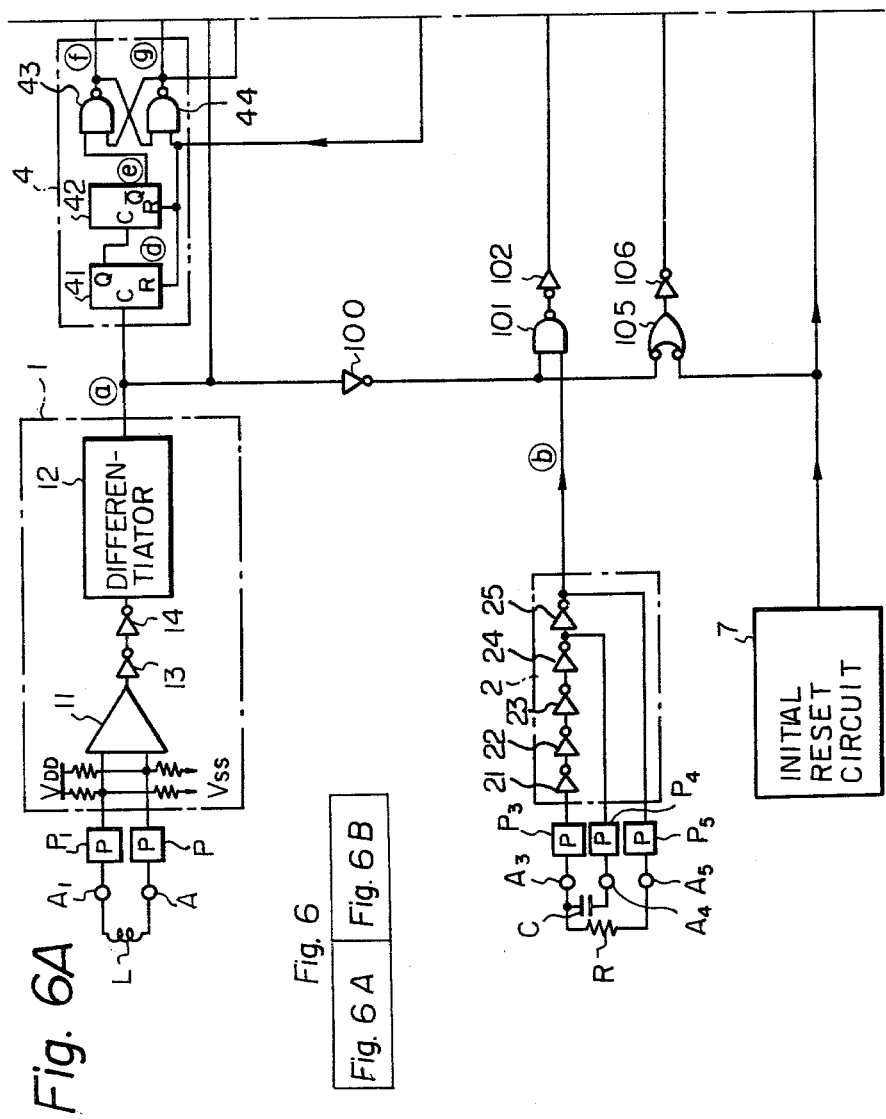

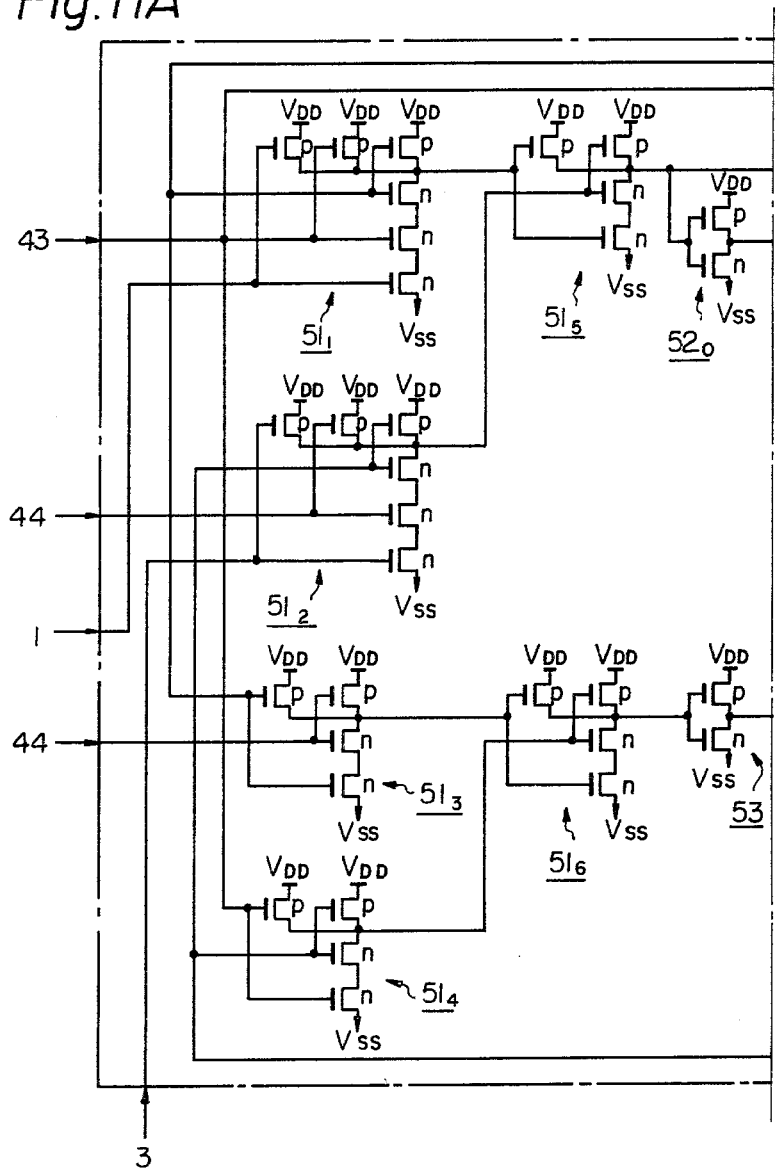

TIME-PERIOD COMPARING DEVICE

BACKGROUND OF THE INVENTION

1. Field of the Invention

The present invention relates generally to a time-period of a signal with that of a predetermined reference signal and, more particularly, to a time-period comparing device adapted to computer systems and electronic switching systems. The device may be used, for example, for the monitoring for cooling fans for cooling the electrical components of the systems.

In a computer system or an electronic switching system, a considerable number of electrical components, such as integrated circuits (hereinafter referred to as ICs) are contained in a cabinet which is of a relatively small size. During the operation of the components, they generate heat. However, the components, including transistors, diodes, etc., are designed to function only under specified conditions. For example, the components operate properly only within a predetermined range of temperature. Furthermore, the components may be damaged if exposed to temperatures which are too high. At present, in order to prevent the components from being overheated, the components are cooled by using cooling fans. Therefore, it is necessary to monitor the rotational velocity of the fans continuously and to provide an alarm signal when the rotational velocity drops below a predetermined value.

2. Description of the Prior Art

In one prior art device for monitoring the rotational velocity of a fan, a motor for driving the fan is provided with a tachometer generator. Thus the device produces an alarm signal when the output of the tachometer generator drops below a predetermined value. However, it is difficult to mount the device on a cooling fan system since the device is of a relatively large size. Furthermore, the cost of the device is high.

Another prior art device for monitoring the rotational velocity of a fan includes a sensor for detecting the rotational velocity of the fan photo-electrically or electromagnetically. This monitoring device also includes an electric circuit for comparing the rotational velocity signal generated by the sensor with a reference signal which is generated by using a monostable multivibrator. However, since the time-period of the rotational velocity of the fan is relatively long, a high capacitance capacitor for determining the reference time-period of the monostable multivibrator is necessary. Therefore, if this device is manufactured as an IC, the capacitor has to be connected outside the IC so that the number of terminals of the IC increases. This terminal number is limited by mechanical tolerance associated with the physical dimensions of the IC. In addition, elements, such as capacitors and resistors, for determining the time-period of the reference signal, are affected by various ambient conditions, for example, ambient temperature, so that the time-period of the reference signal is unstable.

SUMMARY OF THE INVENTION

It is an object of the present invention to provide a time-period comparing device for monitoring a fan, by comparing the time-period of a signal with that of a predetermined reference signal. The device of the present invention is relatively small in size and low in cost, and is also easy to mount on cooling fan systems.

It is another object of the present invention to provide a time-period comparing device manufactured as an IC with small physical dimensions, which has no external high value capacitors.

It is a further object of the present invention to provide a time-period comparing device which operates stably, regardless of ambient conditions.

It is a still further object of the present invention to provide a time-period comparing device which operates properly, even if an irregular signal, which may be generated from a pickup for detecting the velocity of a fan, is input to this device.

It is a still further object of the present invention to provide a time-period comparing device which operates properly soon after the power thereto is turned on.

According to the present invention, there is provided a time-period comparing device for comparing the time-period of an input signal with that of a reference signal, comprising: an input circuit for inputting the input signal; an oscillator; a reference period comparing means for receiving the input signal and the output signal of the oscillator, whereby the reference period comparing means generates a rectangular signal or a definite level signal in response to the frequency of the input signal. This device further comprises a time-period comparator for comparing the input signal with the output signal of the reference period comparing means, whereby said time-period comparator produces two different signals corresponding to the time-period of the input signal relative to that of the reference signal.

The present invention will be more apparent from the ensuing description with reference to the accompanying drawings.

BRIEF DESCRIPTION OF THE DRAWINGS

FIGS. 2A, 2B, 2C, 2D, 2E, 2F and 2G are timing diagrams showing the signals "a", "b", "c", "d", "e", "f" and "g", respectively, appearing in FIG. 1;

FIGS. 3A, 3B, 3C, 3D, 3E, 3F and 3G are also timing diagrams showing the signals "a", "b", "c", "d", "e", "f" and "g" respectively, appearing in FIG. 1;

FIGS. 4A and 4B are block circuit diagrams illustrating a second embodiment of the time-period comparing device of the present invention;

FIGS. 5A, 5B, 5C, 5D, 5E and 5F are timing diagrams showing the signals "a", "i", "f", "g", "j" and "k", respectively, appearing in FIG. 4;

FIGS. 6A and 6B are block circuit diagrams of a third embodiment of the time-period comparing device of the present invention;

FIGS. 11A, 11B and 11C are circuit diagrams illustrating the preventing circuit 5 of the devices of FIGS. 4 and 6;

DESCRIPTION OF THE PREFERRED EMBODIMENTS

Figure 1:
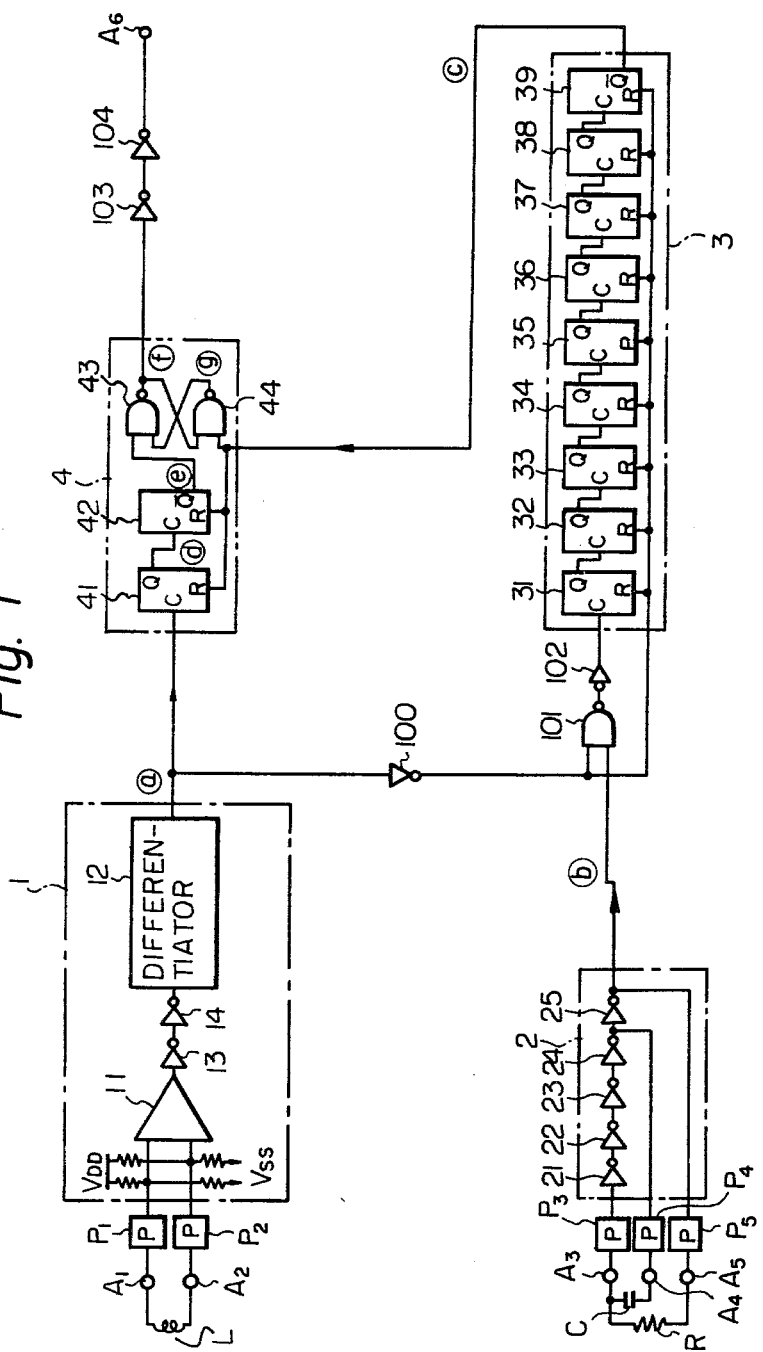
FIG. 1 is a block circuit diagram illustrating a first embodiment of the time-period comparing device of the present invention.

Referring to FIG. 1, the time-period comparing device of the present invention is mainly composed of an input circuit 1, a reference oscillator 2, a reference period counter 3 including, for example, nine binary counter stages 31, 32, ..., 39 connected in series, and a time-period comparator 4 including two binary counter stages 41 and 42, and further, including a latch circuit formed by two NAND gates 43 and 44. The device is an eight-terminal module having two input terminals $A_1$ and $A_2$, three terminals $A_3$, $A_4$ and $A_5$ for connecting an external capacitor C and an external resistor R, which determine the frequency of the reference oscillator 2, an output terminal $A_6$ from which an alarm signal is transmitted to other devices, and direct current supply terminals $V_{SS}$ and $V_{DD}$. To the terminals $A_1$ through $A_5$ are connected protection circuits $P_1$ through $P_5$, respectively, for preventing a voltage signal than $V_{DD}$ from being input to the device.

In the input circuit 1 of FIG. 1, a sine wave signal generated from a coil L is amplified by a differential amplifier 11. Next, the signal is differentiated by a differentiator 12 and a pulse-shaped wave signal "a" results. The signal "a" is supplied to a clock terminal of the binary counter stage 41 and a reset terminal of each of the binary counter stages 31 through 39. The coil L is contained in a pickup (not shown) for detecting the rotational velocity of a fan (not shown) associated with a permanent magnet (not shown). The fan may be used for cooling a computer system or an electronic switching system.

The reference oscillator 2 is composed of a series of five inverters 21, 22, 23, 24 and 25, in which the input of inverter 21 is connected to terminal $A_3$ via the protection circuit $P_3$ and the outputs of the inverters 24 and 25 are connected to the terminals $A_4$ and $A_5$ via the protection circuits $P_4$ and $P_5$, respectively. The oscillating frequency of the reference oscillator 2, which is, for example, 7.25 KHz, is determined by selecting the values of the capacitor C and the resistor R. Since the frequency is relatively high, the time constant for determining the frequency is smaller than that of the prior art whose frequency is, for example, 28.3 Hz. In the present invention, the values of the capacitor C and the resistor R can be selected as 0.001 $\mu F$ and 69 k$\Omega$, respectively, while in the above-mentioned prior art, the values of the capacitor C and the resistor R are, for example, selected as 0.5 $\mu F$ and 69 k$\Omega$, respectively.

The reference period counter 3 produces a reference period signal "c" by counting pulses generated by the reference oscillator 2. For example, assuming that the frequency of the pulse-shaped signal "a" is relatively low, after each of the binary counter stages 31 through 39 is reset by the signal "a", so that the binary counter stage 39 produces a high logical level "H" which serves as an output of the reference period counter 3, the binary counter stages are sequentially set by the signal "b". Finally, when the binary counter stage 39 is set, the stage 39 inverts its output from a high logical level "H" to a low logical level "L". As a result, the reference period signal "c" becomes a rectangular wave signal whose frequency is the same as that of the signal "a". The width t of the rectangular wave of the signal "c" is, for example, 0.0353 sec ($=2^{9-1}/7250$), if the frequency of the reference oscillator 2 is 7.25 KHz. Next, assuming that the frequency of the pulse-shaped signal "a" is relatively high, for example, higher than 28.3 Hz corresponding to the time-period of 0.0353 sec, then before the binary counter stage 39 is set by the signal "b", each of the binary counter stages 31 through 39 is reset by the signal "a". Therefore, there is no chance for the binary counter stage 39 to be set, so that the reference period signal "c" remains at a high logical level "H". Thus, the reference period signal "c" is a rectangular wave signal when the frequency of the pulse-shaped wave signal "a" is lower than a predetermined value, for example, 28.3 Hz, while the reference period signal "c" remains at a definite level, namely, at a high logical level "H" when the frequency of the signal "a" is higher than the above-mentioned predetermined value. Such a reference period signal "c" is supplied to the time-period comparator 4.

In the time-period comparator 4 of FIG. 1, the pulse-shaped signal "a" is supplied to a clock terminal C of the binary counter stage 41, whose output Q is connected to a clock terminal C of the binary counter stage 42. An output $\overline{Q}$ of the binary counter stage 42 is connected to an input of NAND gate 43 which is cross-coupled to NAND gate 44. The reference period signal "c" is supplied to resets R of the binary counter stages 41 and 42, and to an input of NAND gate 44. These NAND gates 43 and 44 form a latch circuit having two stable states. For example, in a first stable state of the latch circuit, an output of NAND gate 43 is at a low logical level "L", while an output of NAND gate 44 is at a high logical level "H". Similarly, in a second stable state of the latch circuit, the output of NAND gate 43 is at a high logical level "H", while the output of NAND gate 44 is at a low logical level "L". The first stable state turns into the second stable state only when the level of the signal "e" is at a low logical level "L" and the level of the signal "c" is at a high logical level "H". Contrary to this, the second stable state turns into the first stable state only when the level of the signal "e" is at a high logical level "H" and the level of the signal "c" is at a low logical level "L".

The operation of the device of FIG. 1 will now be explained in greater detail.

FIGS. 2A, 2B, 2C, 2D, 2E, 2F and 2G are timing diagrams showing the signals "a", "b", "c", "d", "e", "f" and "g", respectively, appearing in FIG. 1. Assume that the rotational velocity of a fan (not shown) is lower than a predetermined value, for example, 1700 rpm, which corresponds to a frequency of 28.3 Hz and a time-period of 0.0353 sec. In this case, the signal "a", as shown in FIG. 2A, at the output of the input circuit 1 is a pulse train signal whose time-period $T_1$ is greater than a predetermined value t, which equals 0.0353 sec, for example. On the other hand, the signal "b", as shown in 2B, at the output of the reference oscillator 2 is a pulse train signal whose time-period $t_0$ is, for example, 0.138 msec, which corresponds to the frequency of 7.25 KHz. After all of the binary counter stages 31 through 39 of the reference period counter 3 are reset by the signal "a", $2^{l-1}$ pulses of the signal "b", in which l equals 9 in this case, are supplied to the reference period counter 3, so that the last stage 39 is set. As a result, the last stage 39 inverts its output level from a high logical level "H" to a low logical level "L". Therefore, the last stage 39 produce a reference period signal "c", as shown in FIG. 2C, in which the width t of the signal "c" is $t_0 \times 2^{l-1}$, namely, 0.0353 sec. This width t is a reference time-period of the device of FIG. 1. The binary counter stage 41 of the time-period comparator 4 is reset every time it receives a rear edge of the signal "c", as shown in FIG. 2C, while the stage 41 is set every time it receives a pulse of the signal "a", as shown in FIG. 2A. Therefore, the signal "d", as shown in FIG. 2D, at the output of the binary counter stage 41 is similar to the signal "c", as shown in FIG. 2C. Next, the binary counter stage 42 counts the rear edges of the signal "d". At the same time, the stage 42 is reset by the rear edges of the signal "c". As a result, the stage 42 remains at a reset state, so that the output $\overline{Q}$ of the stage 42 remains at a high logical "H", as shown in FIG. 2E. Therefore, the output signal "f" of NAND gate 43 remains at a low logical level "L", as shown in FIG. 2F, and the output signal "g" of NAND gate 44 remains at a high logical level "H", as shown in FIG. 2G, since the signal "e" remains at a high logical level "H", even if the signal "c" repeats a high logical level "H" and a low logical level "L". As a result, a signal appearing at the output terminal $A_6$ becomes an alarm signal indicating that the rotational velocity of the fan has dropped to less than the predetermined value, for example, 1700 rpm.

FIGS. 3A, 3B, 3C, 3D, 3E, 3F and 3G are also timing diagrams showing the signals "a", "b", "c", "d", "e", "f" and "g", respectively, appearing in FIG. 1. Assuming that the rotational velocity of the fan is higher than the above-mentioned predetermined value, for example, 1700 rpm, the signal "a", as shown in FIG. 3A, at the output of the input circuit 1 is a pulse train signal whose time-period $T_2$ is smaller than the predetermined value t, for example, 0.0353 sec. The signal "b" at the output of the reference oscillator 2 is shown in FIG. 3B, which is the same as FIG. 2B. After all of the binary counter stages 31 through 39 of the reference period counter 3 are reset by the signal "a", pulses of the signal "b" are counted so that the binary counter stages are sequentially set. However, the last stage 39 can not be set, since all of the stages 31 through 39 are reset again by the signal "a" before the last stage 39 is set. Therefore, the reference period signal "c" remains at a high logical level "H", as shown in FIG. 3C, so that the binary counter stages 41 and 42 of the time-period comparator 4 do not remain in a reset state. As a result, each of the binary counter stages 41 and 42 operates as a ½ frequency divider. Therefore, the signal "d", as shown in FIG. 3D, at the output Q of the binary counter stage 41 is a signal whose frequency is half that of the signal "a". Furthermore, the signal "e", as shown in FIG. 3E, at the output $\overline{Q}$ of the binary counter stage 42 is a signal whose frequency is one quarter that of the signal "a". However, since the input of NAND gate 44 remains at a high logical level "H", the output signal "f", as shown in FIG. 3F, at the output of NAND 43 remains at a high logical level "H", while the output signal "g", as shown in FIG. 3G, at the output of NAND gate 44 remains at a low logical level "L". As a result, a signal appearing at the output terminal $A_6$ is not an alarm signal. Thus, each of two states depending upon the time-period of a signal compared with a reference signal corresponding to either of two states of the latch circuit. Therefore, a state where the time-period of the signal is longer than that of the reference signal, i.e., where the rotational velocity of the fan is smaller than the rated value, can be detected to produce an alarm signal by using one output of the latch circuit.

FIG. 4 is a block circuit diagram illustrating a second embodiment of the time-period comparing device of the present invention. The elements illustrated in FIG. 4 which are identical with those of FIG. 1 are given the same reference numerals as used in FIG. 1. The device of FIG. 4 further includes a preventing circuit 5 for preventing this device from operating due to an irregular signal generated from a pickup (not shown) for detecting the rotational velocity of a fan (not shown). The inductance coil L is installed in the pickup and is used for detecting the rotational velocity of the fan. However, the inductance coil L may be excited by a strong electromagnetic field generated in the proximity of the motor for driving the fan. If inductance coil L is excited it generates an irregular signal which causes the latch circuit of the time-period comparator 4 to change its state often. The preventing circuit 5 is used to eliminate the results of such an irregular signal. The preventing circuit 5 includes a latch circuit formed by two NAND gates 59 and 60 cross-coupled, which is similar to the latch circuit formed by two NAND gates 43 and 44. The preventing circuit 5 further includes a first group of gates, composed of two NAND gates $51_1$ and $51_2$, and one inverted input OR gate $51_5$. In this case, NAND gate $51_5$ transmits the signal "a" only when the output levels of both NAND gates 43 and 60 are at a high logical level "H", while NAND gate $51_2$ transmits the rectangular-wave part of the signal "i" at the output of the counter stage 38 only when the output levels of both NAND gates 44 and 60 are at a high logical level "H". Thus, neither of NAND gates $51_1$ and $51_2$ transmits the signal "a" or the rectangular-wave part of the signal "i" when the states of the two latch circuits are different. The preventing circuit also includes a second group of gates composed of two NAND gates $51_3$ and $51_4$, and one inverted input OR gate $51_6$. In this case, one of the NAND gates $51_3$ and $51_4$ changes its output level when the output levels of the latch circuit formed by two NAND gates 43 and 44 changes, and the change is transmitted to the reset terminal of the n-ary counter (n equals $2^5$ in this case) composed of five binary counter stages $52_1$, $52_2$, $52_3$, $52_4$ and $52_5$. Thus, when the value of the n-ary counter is (n-1), the output level of NAND gate 54 becomes a low logical level "L". As a result, the state of the latch circuit formed by two NAND gates 43 and 44 is transmitted to the latch circuit formed by two NAND gates 59 and 60 through two NAND gates 57 and 58.

The operation of the device of FIG. 4 will now be explained in detail.

FIGS. 5A, 5B, 5C, 5D, 5E and 5F are timing diagrams showing the signals "a", "i", "f", "g", "j" and "k", respectively, appearing in FIG. 4. For a first interval I, if it is assumed that the rotational velocity of the fan is higher than a predetermined value, the signal "a" at the output of the input circuit 1 is as shown in FIG. 5A. A signal "i" generated from the counter stage 38 of the reference period counter 3 is at a high logical level "H". For this internal I, as has been mentioned in connection with FIG. 1, the signal "f" at the output of NAND gate 43 is at a high logical level "H", as shown in FIG. 5C, while the signal "g" at the output of NAND gate 44 is at a low logical level "L", as shown in FIG. 5D.

For a second interval II, if it is assumed that the rotational velocity of the fan is lower than the predetermined value, the signal "a" is as shown in FIG. 5A and the rectangular part of the signal "i" has a width of a rectangular wave which width is a half of that of the signal "c" at the output of the counter stage 39. Since the signal "k" is still at a low logical level "L", each of NAND gates $51_1$ and $51_3$ is in a closed state, so that each output of NAND gates $51_1$ and $51_3$ remains at a high logical level "H". On the other hand, NAND gates $51_2$ and $51_4$ are in an open state. Therefore, after the rest state of each of the binary counter stages $52_1$, $52_2$, $52_3$, $52_4$ and $52_5$ is released by the rear edge X of the signal "f" through NAND gate $51_4$, the inverted input OR gate $51_6$ and the inverter 53, the n-ary counter composed of the five counter stages (n equals $2^5$) begins to count the rear edges of the rectangular-wave part of the signal "i", as shown in FIG. 5B. When the (n-1) rear edges of the rectangular-wave part of the signal "i" are counted by the n-ary counter composed of the counter stages $52_1$, $52_2$, $52_3$, $52_4$ and $52_5$, all the counter stages are set so that the output of NAND gate 54 becomes a low logical level "L", which is inverted to a high logical level "H" by the inverter 55. Therefore, the low logical level "L" at the output of NAND gate 43 is transmitted to an input of NAND gate 59, while a high logical level "H", inverted by the inverter 56, is transmitted to an input of NAND gate 60. As a result, the latch circuit formed by the two NAND gates 59 and 60 inverts its state, as shown in FIG. 5E and FIG. 5F.

For a third interval III, if it is assumed again that the rotational velocity of the fan is higher than the predetermined value, since the signal "j" is still at a low logical level "L", each of NAND gates $51_2$ and $51_4$ is in a closed state, so that each output of NAND gates $51_2$ and $51_4$ remains at a high logical level "H". On the other hand, NAND gates $51_1$ and $51_3$ are in an open state. Therefore, after the reset state of each of the binary counter stages $52_1$, $52_2$, $52_3$, $52_4$, and $52_5$ is released by the rear edge Y of the signal "g" through NAND gate $51_3$, the inverted input OR gate $51_6$ and the inverter 53, the n-ary counter begins to count pulses of the signal "a", as shown in FIG. 5A. However, before the n-ary counter counts (n-1) pulses (n equals 32, here), the interval III is completed, so that the output of NAND gate 54 remains at a high logical level "H". As a result, the latch circuit formed by two NAND gates 59 and 60 does not invert its state as shown in FIGS. 5E and 5F.

As mentioned above, in response to the changes of the frequency of the input signal "a", the first latch circuit formed by two NAND gates 43 and 44 inverts its state. However, the second latch circuit formed by two NAND gates 59 and 60 does not always invert its state, after the first latch circuit inverts its state. Namely, the second latch circuit inverts its state only when the first latch circuit remains in a stable state continuously for more than a definite term which is determined by counting the pulses of the signal "a" or the rear edges of the rectangular-wave part of the signal "i". Therefore, even if the inductance coil L produces an irregular signal so that the first latch circuit often inverts its state, the second latch circuit will not invert its state. As a result, a signal at the output terminal $A_6$, which is connected to an output of the second latch circuit, serves as a reliable alarm signal.

Figure 6B:
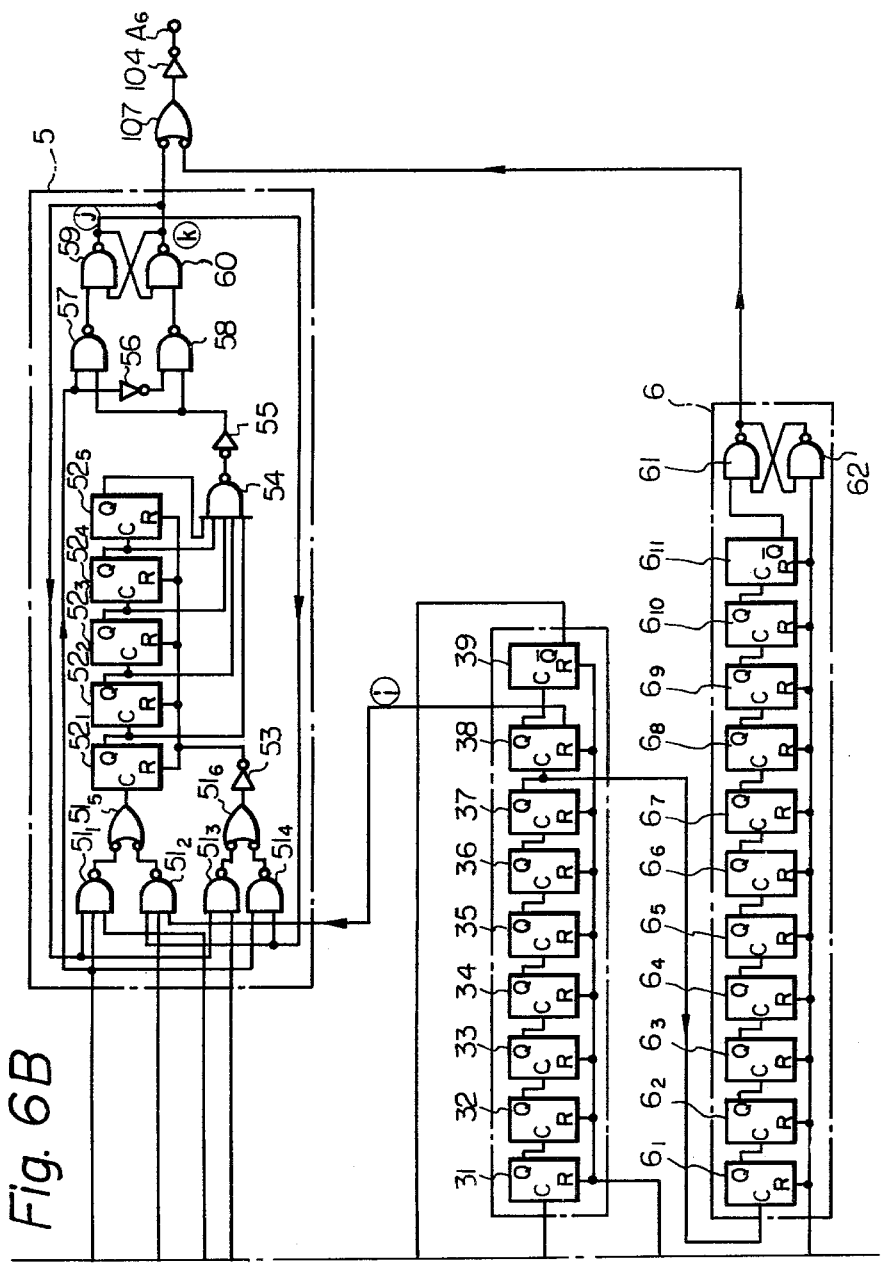

FIG. 6 is a block circuit diagram illustrating a third embodiment of the time-period comparing device of the present invention. The elements illustrated in FIG. 6 which are identical with those of FIG. 4 are given the same reference numerals as in FIG. 4. The device of FIG. 6 further includes a stopping circuit 6 for preventing this device from producing an alarm signal for a definite interval after the power is turned on. Furthermore, the device includes an initial reset circuit 7 for resetting the counter stages contained in the reference period counter 3 and the stopping circuit 6 after the power is turned on. After the power is turned on, the initial reset circuit 7 produces only one reset pulse which is used for resetting the counter stages contained in the reference period counter 3 and the stopping circuit 6. After that, the initial reset circuit 7 produces a logical high level "H", which is maintained until the power is turned off.

The stopping circuit 6 is composed of an m-ary counter, composed of 11 binary counter stages $6_1$, $6_2$, ..., $6_{11}$ (m equals $2^n$) and a latch circuit formed by two NAND gates 61 and 62. When the last binary counter stage $6_{11}$ receives a reset pulse generated from the initial reset circuit 7, the output $\overline{Q}$ of the binary counter stage becomes a high logical level "H", which is applied to an input of NAND gate 61. On the other hand, a low logical level "L" is applied to an input of NAND gate 62. Therefore, the output of NAND 61 becomes a low logical level "L", which is applied to an input of the inverted input OR gate 107, so that the inverted input OR gate 107 is placed in a closed state, while the output of NAND gate 62 becomes a high logical level "H". Thus, even if the preventing circuit 5 produces an alarm signal from the output of NAND gate 60, the alarm signal can not be output from this device.

The reset pulse resets all the binary counter stages 31, 32, ..., 39; $6_1$, $6_2$, ..., $6_{11}$ so that the stages begin to count the pulses generated from the reference oscillator 2, whose frequency is, for example, 7.25 KHz. As a result, a signal whose time-period is about 18 sec ($2^{17}/7250$) is obtained at the output $\overline{Q}$ of the binary counter stage $6_{11}$. Namely, the output $\overline{Q}$ of the binary counter stage $6_{11}$ repeats a high logical level "H" of about 18 sec and a low logical level "L" of about 18 sec, alternately. However, since the output of the initial reset circuit 7 is maintained at a high logical level "H" until the power is off, the latch circuit formed by two NAND gates 61 and 62 inverts its state only in response to the first change of the output $\overline{Q}$ of the last counter stage $6_{11}$. After that, the output of NAND gate 61 is maintained at a high logical level "H", so that the inverted input OR gate 107 is maintained in a open state. Thus, the inverted input OR gate 107 is in a closed state for about 18 sec, for example, from the time the power is turned on. Namely, this device of FIG. 6 never produces an alarm signal from its output terminal $A_6$ for about 18 sec from the time the power is turned on.

Figure 7:
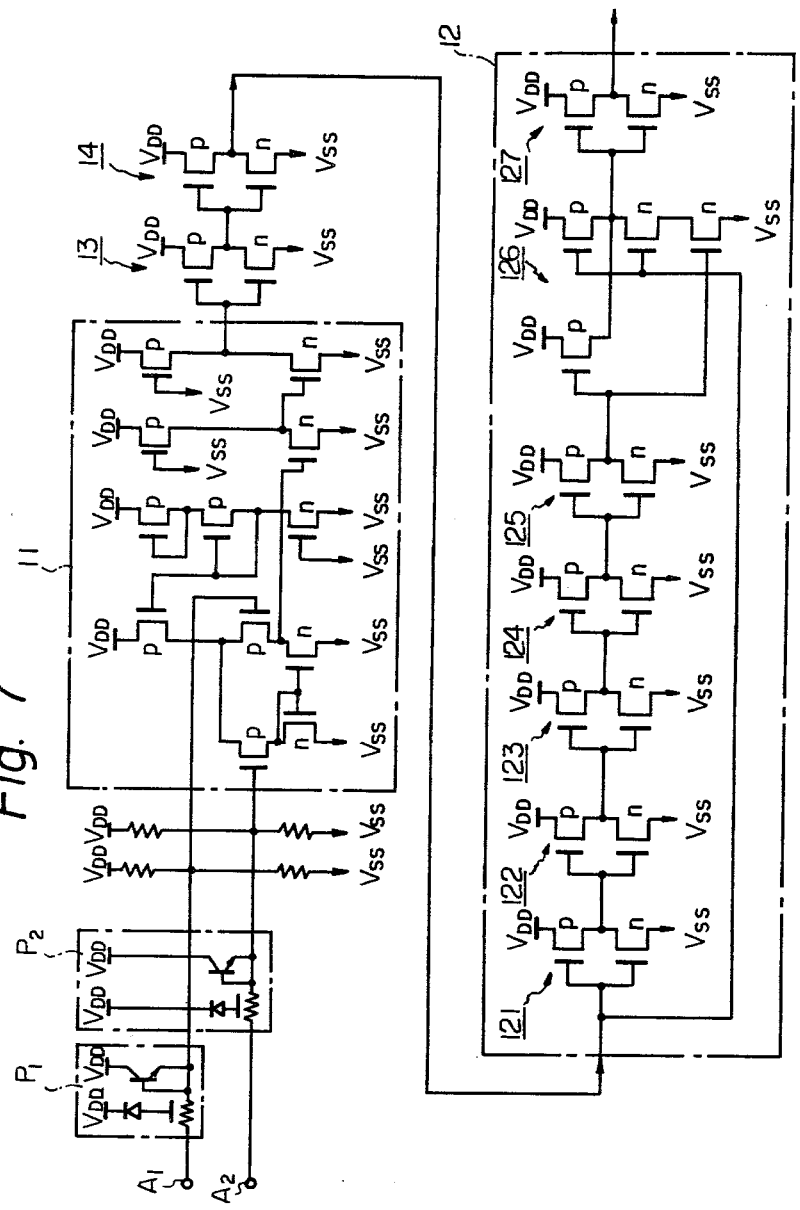
FIG. 7 is a circuit diagram illustrating the input circuit 1 of the devices of FIGS. 1, 4 and 6.

FIG. 7 is a circuit diagram illustrating the input circuit 1 of the devices of FIGS. 1, 4 and 6. In FIG. 7, the elements, such as a diode, a resistor and a transistor, in the protection circuit $P_1$ and $P_2$ may be manufactured by using Complementary Metal Oxide Semiconductor (hereinafter referred to as CMOS) technology. The differential amplifier 11 formed by twelve MOS transistors may also be manufactured by using CMOS technology. Usually, one CMOS inverter is composed of a p-type MOS transistor and a n-type MOS transistor. Each of the inverters 13 and 14 formed by two MOS transistors may be manufactured by using CMOS technology. The differentiator 12 is composed of a series of five inverters $12_1$, $12_2$, $12_3$, $12_4$ and $12_5$, each of which is formed by two MOS transistors, a NAND gate $12_6$, which is formed by four MOS transistors, and an inverter $12_7$ formed by two MOS transistors, so that the differentiator 12 may be manufactured by using CMOS technology. In the differentiator 12, an input of the first inverter $12_1$ and an output of the fifth inverter $12_5$ are connected to inputs of NAND gate $12_6$, respectively.

Thus, the input circuit 1 as a whole may be manufactured by using CMOS technology.

Figure 8:
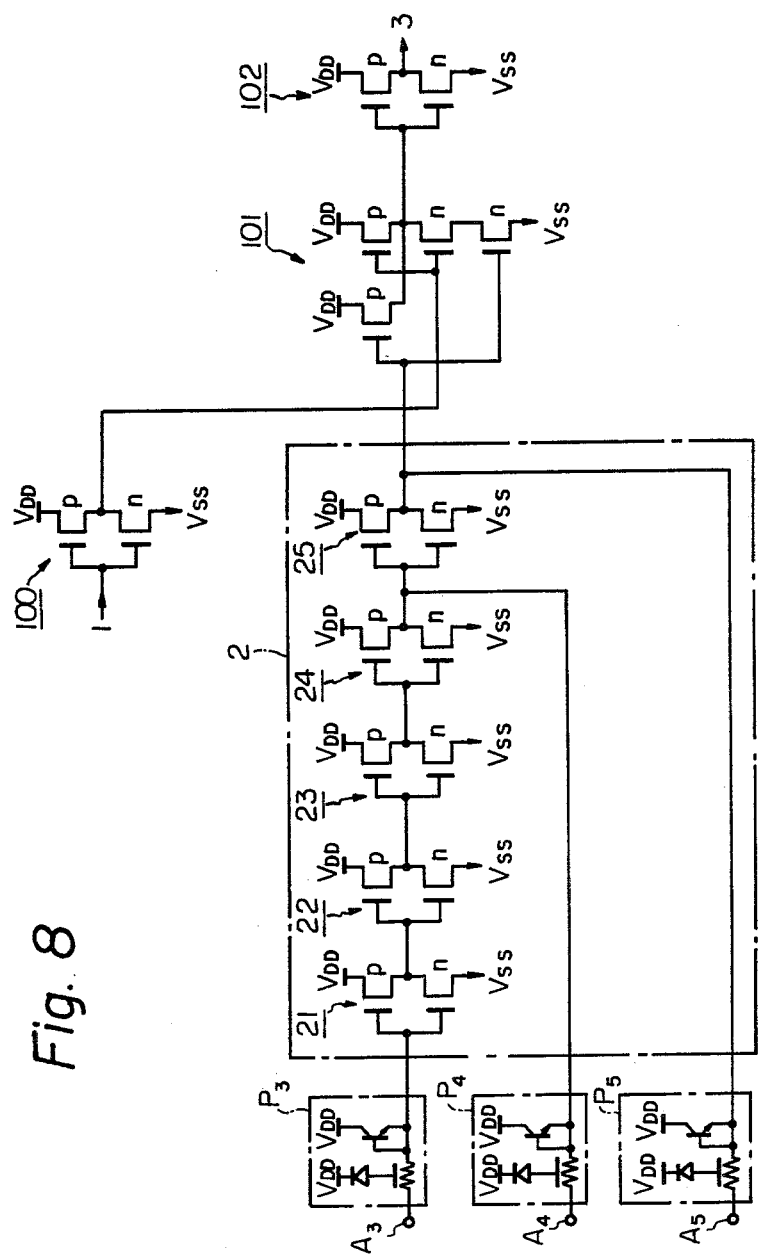
FIG. 8 is a circuit diagram illustrating the reference oscillator 2 of the devices of FIGS. 1, 4 and 6.

FIG. 8 is a circuit diagram illustrating the reference oscillator 2 of the devices of FIGS. 1, 4 and 6. Each of the inverters 21, 22, 23, 24 and 25 is formed by two MOS transistors, so that the reference oscillator 2 as a whole may be manufactured by CMOS technology.

Figure 9:
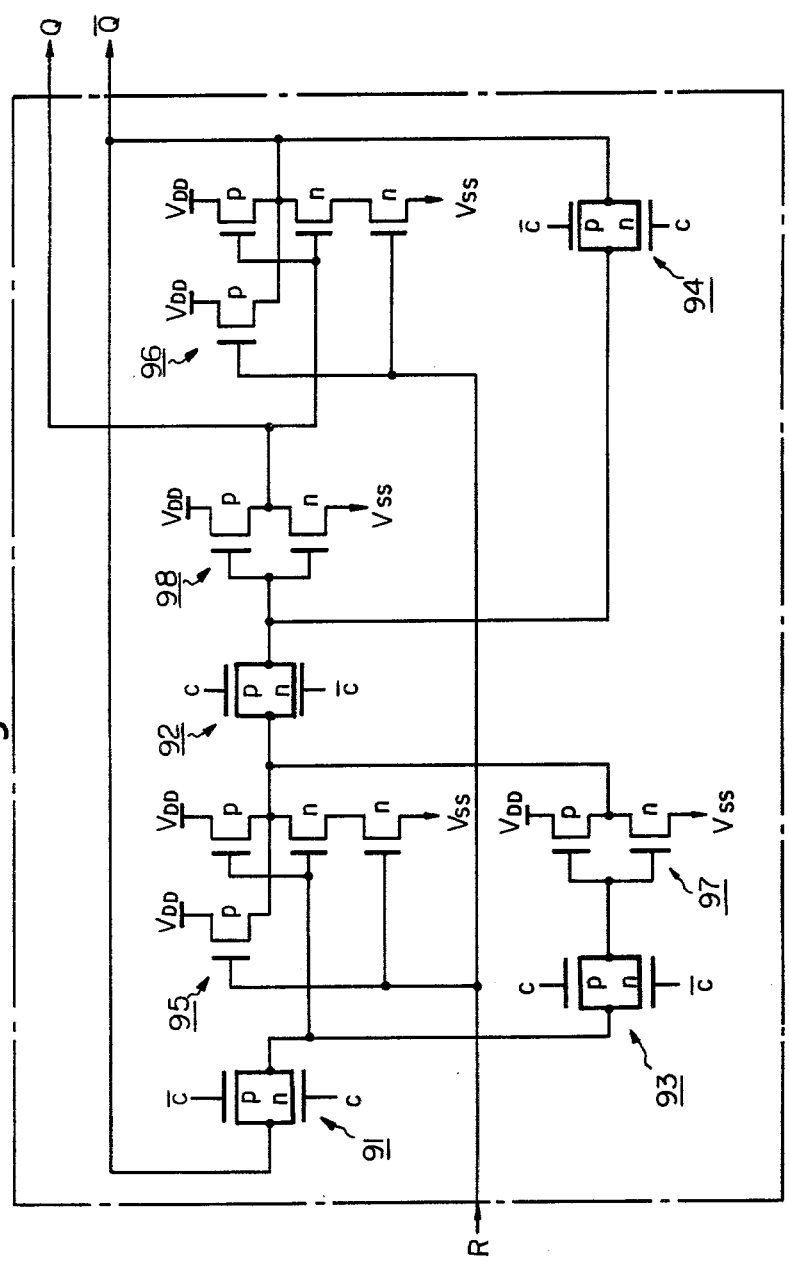
FIG. 9 is a circuit diagram illustrating the binary counter stages of the devices of FIGS. 1, 4 and 6.

FIG. 9 is a circuit diagram illustrating the binary counter stages of the devices of FIGS. 1, 4 and 6. In FIG. 9, the binary counter is composed of: four transmission gates 91, 92, 93 and 94, each of which is formed by two MOS transistors; two NAND gates 95 and 96, each of which is formed by four MOS transistors, and; two inverters 97 and 98, each of which is formed by two MOS transistors. Therefore, the binary counter stages as a whole may be manufactured by using CMOS technology.

Figure 10:
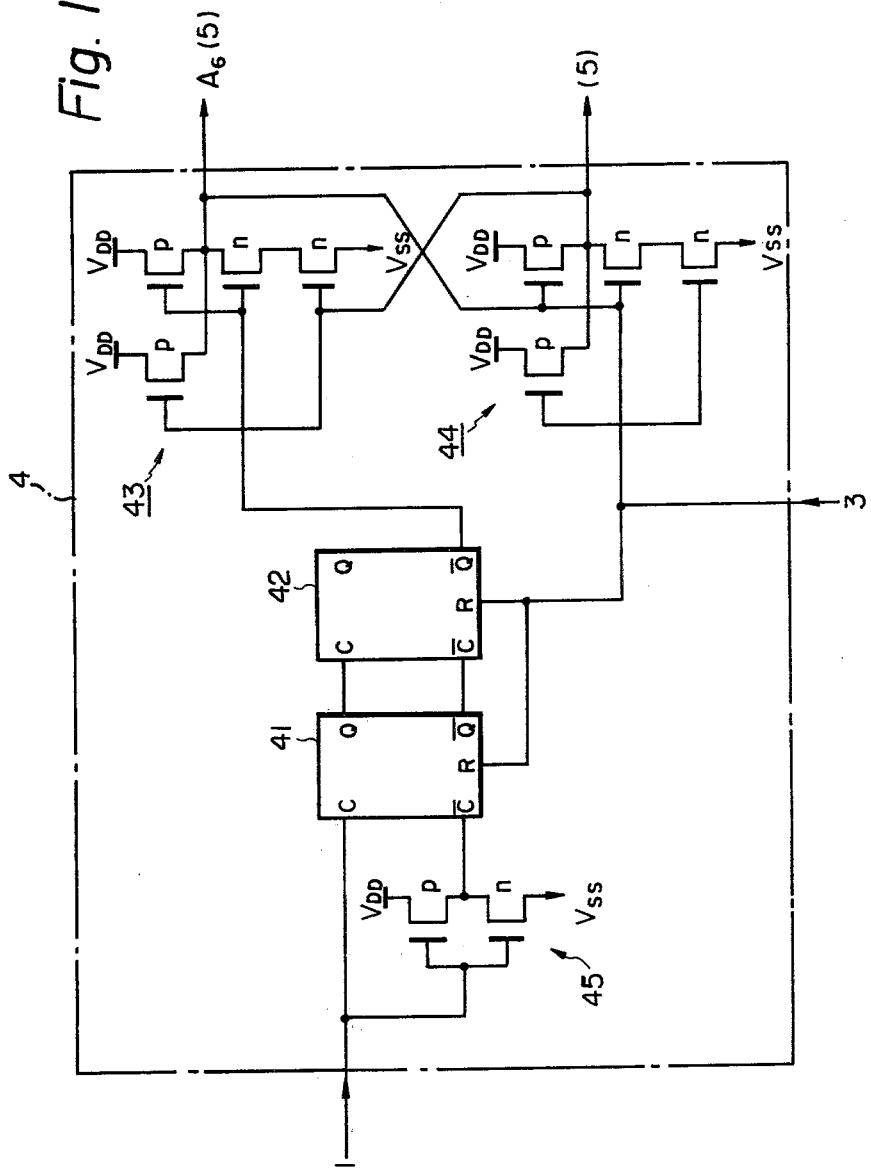
FIG. 10 is a circuit diagram illustrating the time-period comparator 4 of the devices of FIGS. 1, 4 and 6.

FIG. 10 is a circuit diagram illustrating the time-period comparator 4 of the devices of FIGS. 1, 4 and 6. As shown in FIG. 10, each of the binary counter stages 41 and 42 has an inverting clock terminal $\bar{C}$, which is omitted in FIGS. 1, 4 and 6, so that an inverter 45 formed by two MOS transistors is added in FIG. 10. The elements, such as the binary counter stages 41 and 42, and NAND gates 43 and 44, are also formed by MOS transistors, so that the time-period comparator 4 as a whole may be manufactured by using CMOS technology.

Figure 11B:
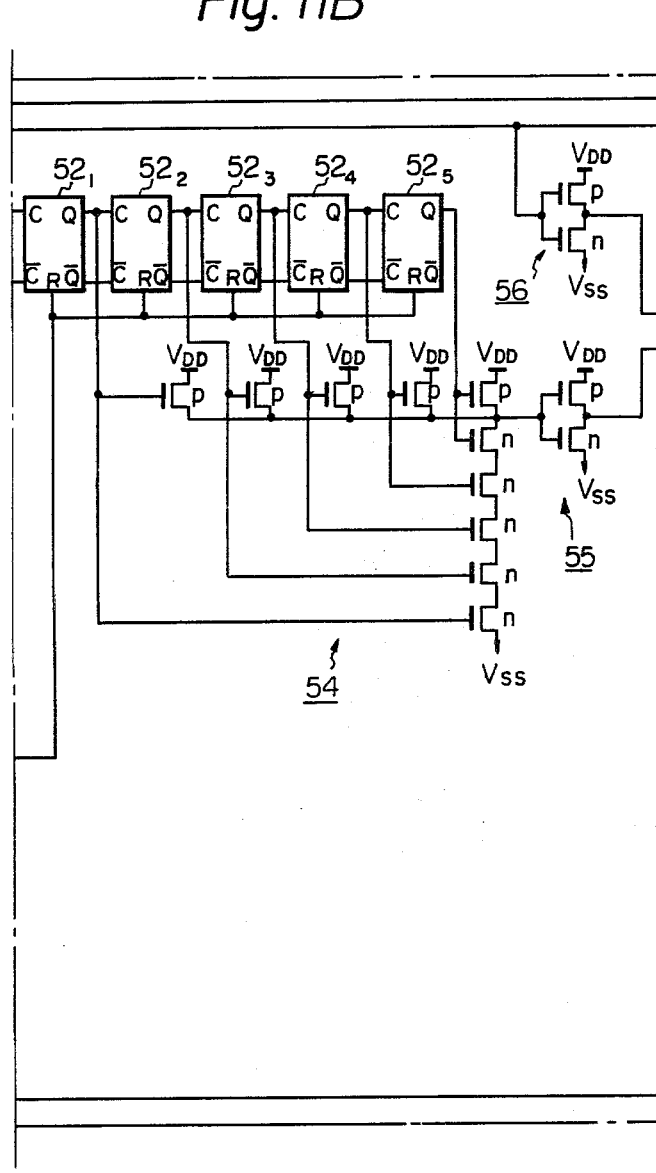
Figure 11C:
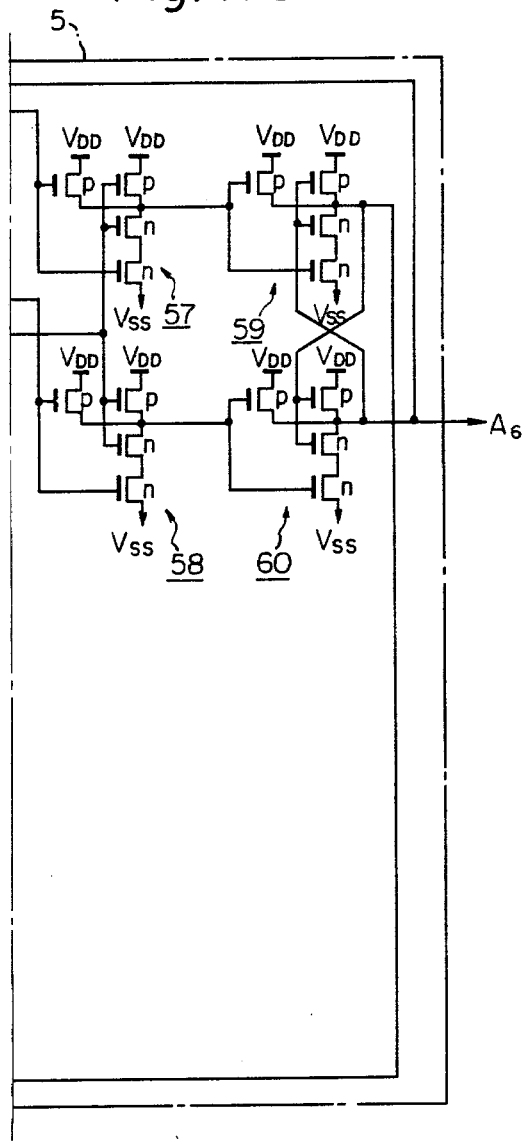

FIG. 11 is a circuit diagram illustrating the preventing circuit 5 of the devices of FIGS. 4 and 6. In FIG. 11, each of NAND gates $51_1$ and $51_2$ which have three inputs, is formed by six MOS transistors, and each of NAND gates $51_3$, $51_4$ and the inverted input OR gates $51_5$ and $51_6$ is formed by four MOS transistors. The output of the inverted input OR gate $51_6$ is connected to the reset terminals R of the binary counter stages $52_1$, $52_2$, $52_3$, $52_4$ and $52_5$ via the inverter 53, formed by two MOS transistors. Also, each of the binary counter stages has an inverting clock terminal $\bar{C}$, which is omitted in FIGS. 4 and 6, so that an inverter $52_0$ formed by two MOS transistors is added in FIG. 11. NAND gate 54, which has five inputs connected to outputs of the binary counter stages $52_1$, $52_2$, $52_3$, $52_4$ and $52_5$, respectively, is formed by ten MOS transistors. Furthermore, each of the inverters 55 and 56 is formed by two MOS transistors and each of NAND gates 57, 58, 59 and 60 is formed by four MOS transistors. As a result, the preventing circuit 5 as a whole may be manufactured by using CMOS technology.

Figure 12:
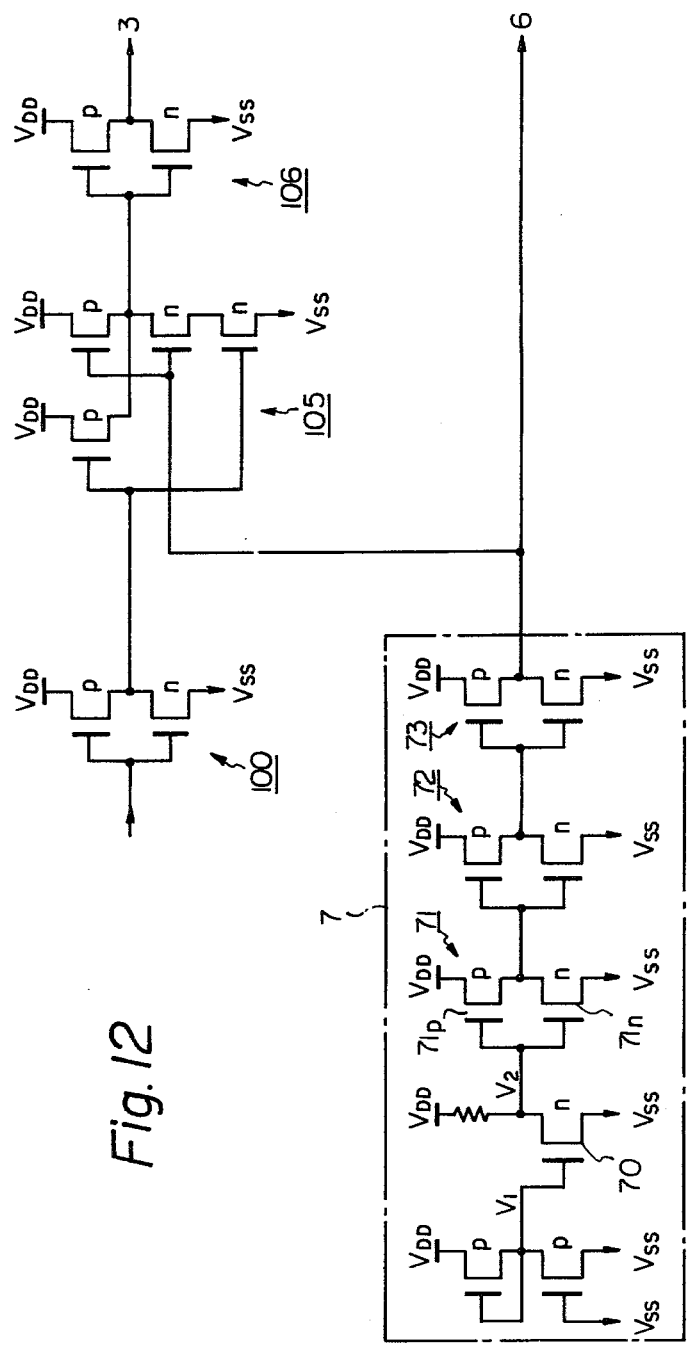
FIG. 12 is a circuit diagram illustrating the initial reset circuit 7 of the device of FIG. 6.

FIG. 12 is a circuit diagram illustrating the initial reset circuit 7 of the device of FIG. 6. In FIG. 12, when the power is turned on, the voltage $V_{DD}$ goes up gradually so that the voltage $V_2$ goes up gradually. Then, at first, the n-type transistor $71_n$ remains in a non-conducting state. When the voltage level $V_2$ ($V_{DD}$) equals a threshold value of the transistor $71_n$, the output level of the inverter 71 equals at a low logical level "L". After that, when the voltage level $V_1$ equals a threshold value of the transistor 70, the transistor 70 conducts. As a result, the voltage level $V_2$ equals a low level which is about the same as the voltage $V_{SS}$ so that the inverter 71 inverts its state to a high logical level "H". Thus, the initial reset circuit 7 produces a pulse which is used for resetting the binary counter stages contained in the reference period counter 3 and the stopping circuit 6 and, after that, produces a high logical level "H" which is maintained until the power is turned off.

As has been mentioned above, each of the circuits contained in the devices of FIGS. 1, 4 and 6 may be manufactured by using CMOS technology. Therefore, each of the devices of FIGS. 1, 4 and 6 may be manufactured as an integrated circuit of an 8-terminal module by using CMOS technology. However, it should be noted that each of the devices of FIGS. 1, 4 and 6 can be manufactured by using only p-type MOS technology or only n-type MOS technology, instead of CMOS technology.

As explained hereinbefore, the time-period comparing device according to the present invention has the following advantages over those of the prior art.

(1) The time-period comparing device is of a relatively small size and is low in cost, because it can be manufactured as a small integrated circuit with a small number of terminals by using CMOS technology, p-type MOS technology or n-type MOS technology. Therefore, this device is easy to mount on fan systems.

(2) The time-period comparing device can operate properly, regardless of ambient conditions, because a circuit for generating a reference period signal includes no high value capacitors which are sensitive to ambient conditions, such as ambient temperature.

(3) The time-period comparing device can operate properly even if an irregular signal is input to the device because this device includes means for preventing it from an irregular signal.

(4) The time-period comparing device can operate properly just after the power is turned on, because this device includes means for stopping the generation of an alarm signal for a definite interval from the time the power is turned on.

What is claimed is:

1. A time-period comparing device, for comparing the time-period of an input signal with the time-period of a reference signal, comprising:

an input circuit, having an input terminal, for receiving the input signal;

an oscillator for providing a pulse signal;

a reference period comparing means, operatively connected to said input circuit and said oscillator, for receiving the input signal and said pulse signal and for generating the reference signal which is a rectangular signal or a definite level signal in dependence upon the frequency of the input signal;

a time-period comparator, operatively connected to said input circuit and said reference period comparing means, for continuously comparing the input signal with the reference signal and for producing two different signals, each of which is at a direct current level, in dependence upon the relationship between the time-period of the input signal and the time-period of the reference signal.

2. A time-period comparing device, for comparing the time-period of an input signal with the time-period of a reference signal comprising:

a reference oscillator for producing a pulse signal;

a reference period counter, operatively connected to said reference oscillator, for receiving said pulse signal as a clock signal thereof, for receiving the input signal as a reset signal thereof, and for producing the reference signal from an inverting output thereof, the reference signal being either a first rectangular wave signal or a first high logic level signal in dependence upon the time-period of the input signal;

a time-period comparator, operatively connected to said reference period counter, for receiving the input signal and the reference signal and for providing a device output signal in dependence upon the relationship between the time-period of the reference signal and the time-period of the input signal, said time-period comparator including a first counter, operatively connected to said reference period counter, and operatively connected to receive the input signal as a clock signal thereof, for receiving the reference signal as a reset signal thereof, and for providing an inverting output signal, said inverting output signal being either a second high logic level signal or a second rectangular wave signal in dependence upon the time-period of the input signal; said time-period comparator further including a latch circuit, having two inputs connected to an inverting output of said first counter and to said inverting output of said reference period counter, respectively, for receiving said inverting output signal and the reference signal, respectively, and for providing said device output signal, whereby said latch circuit has two different states corresponding to the relationship between the time-period of the input signal and the time-period of the reference signal.

3. A device as set forth in claim 2 having terminals for connecting an external capacitor and an external resistor to the device, wherein said reference oscillator comprises a plurality of inverters connected in series and operatively connected to said reference period counter, the output of an even-numbered one of said plurality of inverters being operatively connected to said first inverter via the external capacitor, and the output of an odd-numbered one of said plurality of inverters being operatively connected to said first inverter via the external resistor, whereby the values of the capacitance of the external capacitor and the resistance of the external resistor determine the oscillating frequency of said reference oscillator.

4. A device as set forth in claim 3, wherein each of said five inverters comprises two operatively connected MOS transistors.

5. A device as set forth in claim 2, wherein said reference period counter comprises a plurality of binary counter stages connected in series.

6. A device as set forth in claim 3, wherein said first counter comprises two binary counter stages connected in series.

7. A time-period comparing device, for comparing the time-period of an input signal with the time-period of a reference signal, comprising:

a reference oscillator for providing a pulse signal;

a reference period counter, operatively connected to said reference oscillator, for receiving said pulse signal as a clock signal, for receiving the input signal as a reset signal thereof, and for producing the reference signal from an inverting output, the reference signal being either a first rectangular wave signal or a first high logical level signal in dependence upon the time-period of the input signal;

a time-period comparator, operatively connected to said reference period counter, for receiving the input signal and the reference signal and for providing a device output signal in dependence upon the relationship between the time-period of the reference signal and the time-period of the input signal, said time-period comparator including a first counter, operatively connected to said reference period counter, for receiving the input signal as a clock signal thereof, for receiving the reference signal as a reset signal thereof, and for providing an inverting output signal, said inverting output signal being either a second high logical level signal or a second rectangular wave signal in dependence upon the time-period of the input signal; said time-period comparator further including a first latch circuit, having two inputs connected to an inverting output of said first counter and to said inverting output of said reference period counter for receiving said inverting output signal and the reference signal, respectively, and for providing said device output signal, whereby said first latch circuit has two different states corresponding to the relationship between the time-period of the input signal;

preventing means, operatively connected to said reference period counter and said time-period comparator, for preventing said device from operating when the input signal is an irregular signal, said preventing means including a first logic gate circuit operatively connected to said first latch circuit, a second logic gate circuit operatively connected to said first latch circuit, a third logic gate circuit operatively connected to said first latch circuit, an n-ary counter circuit operatively connected to said first, second and third logic gate circuits and a second latch circuit operatively connected to said third logic gate circuit, an output of which serves as an output of said device, said n-ary counter being reset by another signal passed through said second logic gate circuit when the state of said first latch circuit is inverted and counting rear edges of said input signal or said first rectangular signal, the state of said second latch circuit being inverted only when the value of said n-ary counter is $(n-1)$.

8. A device as set forth in claim 7 having terminals for connecting an external capacitor and an external resistor to the device, wherein said reference oscillator comprises a plurality of inverters connected in series and operatively connected to said reference period counter, each of said plurality of inverters being formed by two MOS transistors, the output of an even-numbered one of said plurality of inverters being connected to said first inverter via the external capacitor, and the output of an odd-numbered one of said inverters being connected to said first inverter via the external resistor, whereby the values of the capacitance of the external capacitor and the resistance of the external resistor determine the oscillating frequency of said reference oscillator.

9. A device as set forth in claim 7, wherein said reference period counter comprises a plurality of binary counter stages connected in series.

10. A device as set forth in claim 7, wherein said first counter comprises two binary counter stages connected in series.

11. A time-period comparing device, for comparing the time-period of an input signal with the time-period of a reference signal comprising:

a reference oscillator for producing a pulse signal, a reference period counter, operatively connected to said reference oscillator, for receiving said pulse signal as a clock signal, for receiving the input signal as a reset signal thereof, and for producing the reference signal from an inverting output, the reference signal being either a first rectangular wave signal or a first high level signal in dependence upon the time-period of the input signal;

a time-period comparator, operatively connected to said reference period counter, for receiving the input signal and the reference signal and for providing a device output signal in dependence upon the relationship between the time-period of the reference signal and the time-period of the input signal, said time-period comparator including a first counter, operatively connected to said reference period counter, for receiving the input signal as a clock signal, for receiving the reference signal as a reset signal thereof, and for providing an inverting output signal from said first counter, said inverting output signal being either a second high level signal or a second rectangular wave signal in dependence upon the time-period of the input signal; said time-period comparator further including a first latch circuit, having two inputs connected to an inverting output of said counter and to said inverting output of said reference period counter, respectively, and for providing said device output signal, whereby said first latch circuit has two different states corresponding to the relationship between the time-period of the input signal and the time period of the reference signal;

preventing means, operatively connected to said reference period counter and said time-period comparator, for preventing said device from operating when the input signal is an irregular signal, said preventing means including a first logic gate circuit operatively connected to said first latch circuit, a second logic gate circuit operatively connected to said first latch circuit, a third logic gate circuit operatively connected to said first latch circuit, and n-ary counter circuit operatively connected to said first, second and third logic gate circuits and a second latch circuit operatively connected to said third logic gate circuit, an output of which serves as an output of said device, said n-ary counter being reset by another signal passed through said second logic gate circuit when the state of said first latch circuit is inverted and counting rear edges of said input signal or said first rectangular signal, the state of said second latch circuit being inverted only when the value of said n-ary counter is (n-1);

stopping means, operatively connected to said reference period counter, for preventing said device from operating for a definite interval after the power is turned on, said stopping means including a second counter for counting pulses generated by said reference oscillator through said reference counter, said stopping means further including a third latch circuit, having two inputs connected to an inverting output and a reset terminal of said second counter;

initial reset means operatively connected to said reference period counter and said second counter for resetting said reference period counter and said second counter at a time after the power is turned on;

an inverted input OR gate for producing an output signal of said device, said inverted input OR gate connected to outputs of said second latch circuit and said third latch circuit, whereby said inverted input OR gate is in a closed state for said definite interval.

12. A device as set forth in claim 11, wherein said initial reset means is manufactured by using CMOS technology.

13. A device as set forth in claim 11 having terminals for connecting an external capacitor and an external resistor to the device, wherein said reference oscillator includes a plurality of inverters connected in series, each of said plurality of inverters being formed by two MOS transistors, the output of an even-numbered one of said plurality of inverters being connected to said first inverter via the external capacitor, and the output of an odd-numbered one of said inverters being connected to said first inverter via the external resistor, whereby the values of the capacitance of the external capacitor and the resistance of the external resistor determine the oscillating frequency of said reference oscillator.

14. A device as set forth in claim 11, wherein said reference period counter comprises a plurality of binary counter stages connected in series.

15. A device as set forth in claim 11, wherein said first counter of said time-period comparator comprises two binary stages connected in series.

16. A device as set forth in claim 6, 10, or 15 wherein each of said two binary counter stages comprises:

a first transmission gate, having a clock input operatively connected to receive the input signal, having a first input, and having first and second outputs;

a first NAND gate, having a first input operatively connected to said reference period counter, having a second input operatively connected to the first output of said first transmission gate, and having a output;

a second transmission gate, having a first input operatively connected to the second output of said first transmission gate and having a clock input operatively connected to receive the input signal;

a first inverter circuit, having an input operatively connected to the output of said second transmission gate and having an output;

third transmission gate, having a first input operatively connected to the output of said first NAND gate and the output of said first inverter circuit, having a clock input operatively connected to receive the input signal, and having an output;

a second inverter circuit for providing a first non-inverted output signal, said second inverter circuit having an input operatively connected to the output of said third transmission gate and having an output;

a fourth transmission gate, having an output operatively connected to the output of said third transmission gate, having a clock input operatively connected to receive the input signal, and having a first input;

a second NAND gate, having a first input operatively connected to the output of said second inverter circuit, having a second input operatively connected to said reference period counter, and having an output operatively connected to the first input of said first transmission gate and the first input of said fourth transmission gate at a first node, wherein a first inverted output signal is provided at said first node.

17. A device as set forth in claim 16, wherein each of said first, second, third, and fourth transmission gates comprises two MOS transistors, wherein each of said first and second NAND gates comprises four MOS transistors, wherein each of said first and second inverters comprises two MOS transistors, and wherein said latch circuit of said time period comparator comprises two cross coupled NAND gates, wherein each of said NAND gates comprises four MOS transistors.

18. A device as set forth in claim 5, 9 or 14 wherein each of said plurality of binary counter stages comprises:
   a first transmission gate, having a first input, having a clock input operatively connected to said reference oscillator, and having first and second outputs;
   a first NAND gate having a first input operatively connected to receive the input signal, having a second input operatively connected to the first output of said first transmission gate, and having an output;
   a second transmission gate, having a first input operatively connected to the second output of said first transmission gate and having a clock input operatively connected to said reference oscillator;
   a first inverter circuit, having an input operatively connected to the output of said second transmission gate and having an output;
   a third transmission gate, having a first input operatively connected to the output of said first NAND gate and the output of said first inverter circuit, having a clock input operatively connected to said reference oscillator, and having an output;
   a second inverter circuit for providing a first non-inverted output signal, said second inverter circuit having an input operatively connected to the output of said third transmission gate and said second inverter circuit having an output;
   a fourth transmission gate, having an output operatively connected to the output of said third transmission gate, having a clock input operatively connected to said reference oscillator, and having a first input;
   a second NAND gate, having a first input operatively connected to the output of said second inverter circuit, having a second input operatively connected to receive the input signal, and having an output operatively connected to the first input of said first transmission gate and the first input of said fourth transmission gate at a first node, wherein a first inverted output signal is provided at said first node.

19. A device as set forth in claim 18, wherein each of said first, second, third, and fourth transmission gates comprises two MOS transistors, wherein each of said first and second NAND gates comprises four MOS transistors, and wherein each of said first and second inverters comprises two MOS transistors.

20. A device as set forth in claim 7 or 11 wherein said first logic gate circuit comprises:
   a first NAND gate, having first, second and third inputs and having an output, said second input operatively connected to said first latch circuit and said third input operatively connected to receive the input signal;
   a second NAND gate, having first, second and third inputs and having an output, said second input operatively connected to said first latch circuit, and said third input operatively connected to said reference period counter; and
   a first inverted input OR gate, having first and second inverted inputs and having an output, said first inverted input operatively connected to the output of said first NAND gate, said second inverted input operatively connected to the output of said second NAND gate, and said output operatively connected to said n-ary counter; and wherein said second logic gate circuit comprises:
   a third NAND gate having first and second inputs and an output, said first input operatively connected to said first input of said first NAND gate and said second input operatively connected to said first latch circuit;
   a fourth NAND gate, having first and second inputs and an output, said first input operatively connected to the second input of said first NAND gate and to said first latch circuit, and said second input operatively connected to the first input of said second NAND gate and to said second latch circuit and
   a second inverted OR gate, having first and second inverted inputs and having an output, said first inverted input operatively connected to the output of said third NAND gate, said second inverted input operatively connected to the output of said fourth NAND gate, and said output operatively connected to said n-ary counter; and wherein said third logic gate circuit comprises:
   a fifth NAND gate, having first and second inputs, and having an output, said first input operatively connected to said first latch circuit, the second input of said first NAND gate, and to the first input of said fourth NAND gate, said second input operatively connected to the output of said n-ary counter, and said output operatively connected to said second latch circuit;
   a sixth NAND gate, having first and second inputs and having an output, said first input operatively connected to the first input of said fifth NAND gate, said second input operatively connected to the second input of said fifth NAND gate and to said n-ary counter, and said output operatively connected to said second latch circuit; and wherein said n-ary counter comprises a plurality of binary counter stages and said second latch circuit comprises two cross-coupled NAND gates.

21. A device as set forth in claim 20, wherein each of said first, second, third and fourth NAND gates comprises six MOS transistors, wherein each of said first and second inverted input OR gates comprises four MOS transistors, wherein each of said fifth and sixth NAND gates comprises four MOS transistors, wherein said n-ary counter comprises a plurality of binary counter stages, and wherein said second latch circuit comprises two cross-coupled NAND gates, each of said two cross-coupled NAND gates comprising four MOS transistors.

22. A device as set forth in claim 11, wherein said second counter includes a plurality of binary counter stages, each of said plurality of binary counter stages comprising:
   a first transmission gate, having a clock input operatively connected to said reference period counter, having a first input, and having first and second outputs;

a first NAND gate, having a first input operatively connected to said initial reset circuit, having a second input operatively connected to the first output of said first transmission gate, and having an output;

a second transmission gate, having a first input operatively connected to the second output of said first transmission gate and having a clock input operatively connected to said reference period counter;

first inverter circuit, having an input operatively connected to the output of said second transmission gate and having an output;

a third transmission gate, having a first input operatively connected to the output of said first NAND gate and the output of said first inverter circuit, having a clock input operatively connected to said reference period counter, and having an output;

a second inverter circuit for providing a first non-inverted output signal, said second inverter circuit having an input operatively connected to the output of said third transmission gate and having an output;

a fourth transmission gate, having an output operatively connected to the output of said third transmission gate, having a clock input operatively connected to said reference period counter, and having a first input;

a second NAND gate, having a first input operatively connected to the output of said second inverter circuit, having a second input operatively connected to said initial reset circuit, and having an output operatively connected to the first input of said first transmission gate and the first input of said fourth transmission gate at a first node, wherein a first inverted output signal is provided at said first node.

23. A device as set forth in claim 22, wherein each of said first, second, third, and fourth transmission gates comprises two MOS transistors, wherein each of said first and second NAND gates comprises fourth MOS transistors, wherein each of said first and second inverters comprises two MOS transistors, and wherein said third latch circuit comprises two cross coupled NAND gates, each of which is formed by four MOS transistors.

* * * * *

UNITED STATES PATENT AND TRADEMARK OFFICE
CERTIFICATE OF CORRECTION

PATENT NO. : 4,289,956

DATED : September 15, 1981

INVENTOR(S) : Asami

It is certified that error appears in the above—identified patent and that said Letters Patent is hereby corrected as shown below:

Front page, [73] Assignee, after "Limited", insert
-- Kawasaki-shi, --.

[56] References Cited, change "Siverton" to -- Siverston, Jr. --.

Column 1, line 7, after "period" insert -- comparing device for comparing the time-period --;

line 11, change third occurrence of the word "for" to -- of --.

Column 2, line 28, change "said" to -- the --.

Column 3, line 19, after "signal" insert -- higher --; and change "$V_{DD}$" to -- $V_{DD}$ --.

Column 4, line 59, change "$2^{1-1}$" to -- $2^{\ell-1}$ --; change "1 equals" to -- $\ell$ equals --;

line 64, change "produce" to -- produces --.

line 65, change "$\tau_0 x\ 2^{1-1}$" to -- $\tau_0 \times 2^{\ell-1}$ --.

Column 5, line 58, change "corresponding" to -- correspond --.

Column 6, line 21, change "$51_5$." to -- $51_1$ --.

Column 7, line 3, change "rest" to -- reset --.

UNITED STATES PATENT AND TRADEMARK OFFICE
CERTIFICATE OF CORRECTION

PATENT NO. : 4,289,956

DATED : September 15, 1981

INVENTOR(S) : Asami

Page 2 of 2

It is certified that error appears in the above—identified patent and that said Letters Patent is hereby corrected as shown below:

Column 8, line 10, change "2")" to -- $2^{11}$ ) --;

line 41, change "in a" to -- in an --.

Column 10, line 29, after "from" insert -- operating in response to --.

Column 11, line 48, change "3" to -- 2 --.

Column 13, line 50, In "(n-1)" the "1" should not be in heavy type.

Column 15, line 8, change "cross coupled" to -- cross-coupled --

Column 18, line 18, change "fourth" to -- four --;

line 21, change "cross coupled" to -- cross-coupled --.

Column 14, line 35, change "a" to -- an --.

Signed and Sealed this

Thirteenth Day of April 1982

[SEAL]

Attest:

GERALD J. MOSSINGHOFF

Attesting Officer   Commissioner of Patents and Trademarks